United States Patent
Salcedo-Suner et al.

(10) Patent No.: US 7,167,350 B2
(45) Date of Patent: Jan. 23, 2007

(54) DESIGN IMPLEMENTATION TO SUPPRESS LATCHUP IN VOLTAGE TOLERANT CIRCUITS

(75) Inventors: Jorge Salcedo-Suner, Allen, TX (US); Charvaka Duvvury, Plano, TX (US); Roger A. Cline, Plano, TX (US); Jose A. Cadena-Hernandez, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 325 days.

(21) Appl. No.: 10/982,347

(22) Filed: Nov. 3, 2004

(65) Prior Publication Data

US 2005/0104154 A1 May 19, 2005

Related U.S. Application Data

(60) Provisional application No. 60/520,132, filed on Nov. 14, 2003.

(51) Int. Cl.
*H02H 9/00* (2006.01)
*H01L 23/62* (2006.01)

(52) U.S. Cl. .......................... 361/56; 257/360

(58) Field of Classification Search ............... 361/56; 257/484, 355
See application file for complete search history.

(56) References Cited

U.S. PATENT DOCUMENTS

| | | | | |
|---|---|---|---|---|
| 5,945,713 A | * | 8/1999 | Voldman | 257/355 |
| 5,959,820 A | * | 9/1999 | Ker et al. | 361/111 |
| 6,858,902 B1 | * | 2/2005 | Salling et al. | 257/360 |
| 6,965,504 B2 | * | 11/2005 | Liu et al. | 361/58 |

* cited by examiner

*Primary Examiner*—Stephen W. Jackson
*Assistant Examiner*—Boris Benenson
(74) *Attorney, Agent, or Firm*—Alan K. Stewart; W. James Brady; Frederick J. Telecky, Jr.

(57) ABSTRACT

The voltage tolerant circuit with improved latchup suppression includes: a diode device having a first end coupled to a source voltage node; a first NWELL guard ring surrounding the diode device; a diode coupled between a second end of the string of diodes and an output pad; a second NWELL guard ring surrounding the diode; and a transistor device coupled between the output pad and a substrate node. The NWELL guardrings disrupt the parasitic SCR operation by adding an additional N+ diffusion without affecting the substrate pump current delivered by the diode.

20 Claims, 1 Drawing Sheet

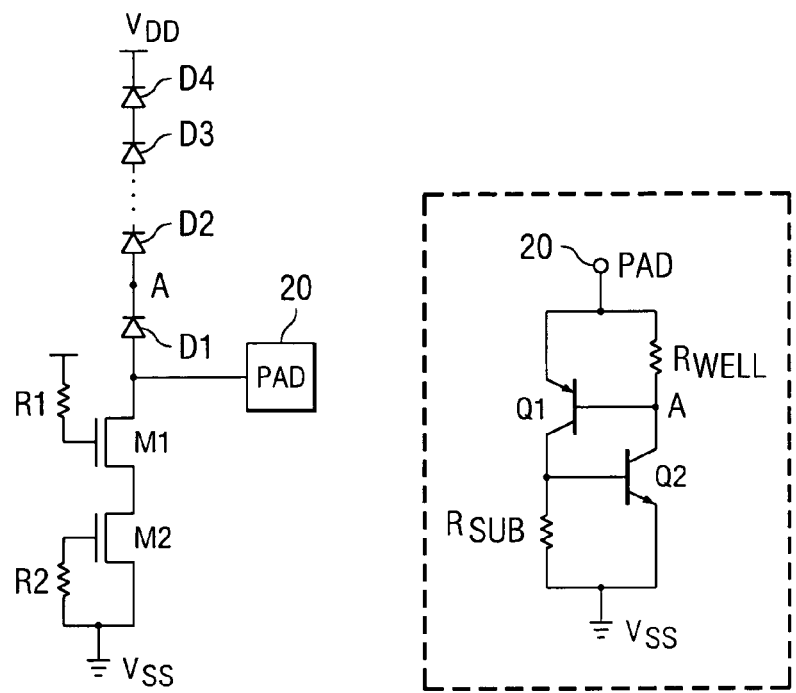
FIG. 1
*(PRIOR ART)*
FIG. 2
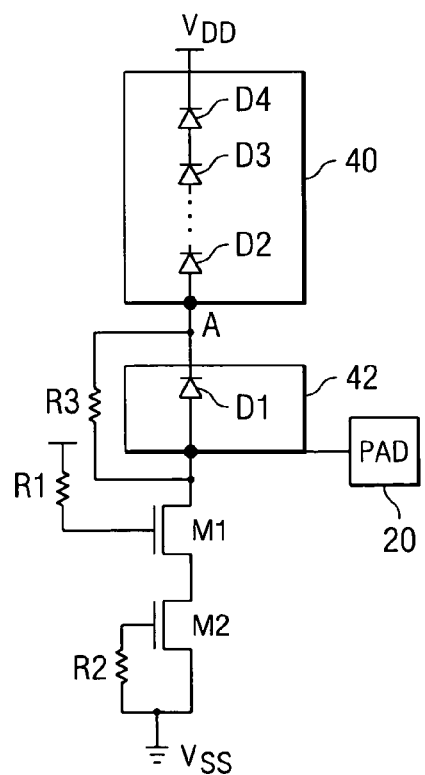
FIG. 3

DESIGN IMPLEMENTATION TO SUPPRESS LATCHUP IN VOLTAGE TOLERANT CIRCUITS

This application claims priority under 35 USC § 119 (e)(1) of provisional application No. 60/520,132 filed Nov. 14, 2003.

FIELD OF THE INVENTION

The present invention relates to electronic circuitry and, in particular, to a voltage tolerant circuit with improved latchup suppression.

BACKGROUND OF THE INVENTION

Signal Latchup deals with a silicon-controlled rectifier (SCR). However, the behavior is different from standard latchup in that the current monitored is from the I/O signal pad. During Signal Latchup, the anode is connected to the signal pin, whereas during standard latchup the anode is connected to the power supply; therefore, an additional latchup effect is possible if current into the signal pin is monitored. The design of voltage tolerant electro static discharge (ESD) protection can lead to Signal Latchup effects.

The primary prior art ESD protection structure used for a voltage tolerant signal pin is made up of cascode NMOS transistors M1 and M2 from the signal pad 20 to node $V_{ss}$, and a series of at least 2 pn diodes from the signal pad 20 to the power supply VDD, as shown in FIG. 1. Diodes D1, D2, D3, and D4 are shown in FIG. 1 as an example. The actual number of series diodes can vary depending on what the voltage tolerant requirements are for a given design. There can be as few as 2 diodes (D1 and D2) in the series. The circuit of FIG. 1 also includes resistors R1 and R2. The placement of diode D1 with respect to the cascode NMOS transistors M1 and M2 is critical to the ESD operation. The parasitic pnp built into diode D1 is being used to pump the local substrate in order to turn on the composite parasitic NPN formed between the drain of transistor M1 and the source of transistor M2. Note that this effective NPN triggers when the cascoded devices are integrated in layout.

Since there are a series of at least 2 diodes involved, node A in FIG. 1 is a high impedance node that forms the base of the parasitic pnp substrate pump. Unfortunately, this parasitic pnp substrate pump is also part of a parasitic SCR that exists between the Pad and node $V_{ss}$ as shown in FIG. 2. Transistors Q1 and Q2, and resistors Rwell and Rsub in FIG. 2 represent parasitic devices between pad 20 and node $V_{ss}$ in FIG. 1.

From the Signal Latchup point of view, if current is pulled out of a neighboring pin while there is sufficient voltage applied across the parasitic SCR, high impedance node A can easily be pulled down to a base-emitter voltage ($V_{be}$) and trigger the parasitic SCR which clamps the pad to node $V_{ss}$. This results in destructive signal pin current that would go undetected during normal latchup testing where only the current at node $V_{DD}$ is monitored.

Since the neighboring pin plays an important role during Signal Latchup, the distance between the neighboring cell and the parasitic SCR cell is critical.

In application systems where Signal Latchup is present, the holding current depends on the input current that an external driver can provide. Also, the input voltage in the application plays a role. If the input/output (I/O) cell changes the input voltage to be below the holding voltage of the parasitic SCR then the I/O pin will not sustain the Signal Latchup. In order to activate the parasitic SCR with anode connected to I/O, a current pulse is needed in the neighboring cell when the input is connected to a voltage higher than the holding voltage of the parasitic SCR (High level in digital signal).

If the I/O is directly connected to a power supply source then it could result in a destructive failure. On the other hand, if it is connected to a bus, the failure could result from unexpected behavior of the system due to bus contention. In the latter case it could cause damage to the other IC's sharing the same bus on the system board.

Failure Mode: Due to Signal Latchup, the SCR appears with the anode connected to the I/O instead of coming from a power supply. This behavior depends on the trigger current from an adjacent cell.

The primary ESD protection structure used for a voltage tolerant signal pin with series PN diodes from the signal pad to the power supply could play an important role due to the parasitic SCR. Therefore, the layout and/or dimensions of the ESD NMOS and diode circuit are directly related to the Signal Latchup performance.

SUMMARY OF THE INVENTION

A voltage tolerant circuit with improved latchup suppression includes: a diode device having a first end coupled to a source voltage node; a first NWELL guard ring surrounding the diode device; a diode coupled between a second end of the diode device and an output pad; a second NWELL guard ring surrounding the diode; and a transistor device coupled between the output pad and a substrate node. The NWELL guardrings disrupt the parasitic SCR operation by adding an additional N+ diffusion without affecting the substrate pump current delivered by the diode.

BRIEF DESCRIPTION OF THE DRAWINGS

In the drawings:

FIG. 1 is a circuit diagram of a prior art ESD protection structure used for a voltage tolerant signal pin;

FIG. 2. is a circuit diagram of a parasitic SCR that exists in the circuit of FIG. 1;

FIG. 3. is a circuit diagram of an ESD protection structure with NWELL guardrings, according to the present invention.

DETAILED DESCRIPTION OF PREFERRED EMBODIMENTS

To improve the Signal Latchup robustness, the parasitic SCR from Pad to node $V_{ss}$, as shown in FIG. 2, must be minimized. Unfortunately, any effort to minimize the parasitic SCR from Pad to node $V_{ss}$ has an adverse affect on ESD robustness. Adding P+ contacts to reduce resistance $R_{sub}$ will prevent the substrate pumping action from diode D1 to properly trigger the parasitic npn across the cascode NMOS transistors M1 and M2, shown in FIG. 1, and should be avoided at all costs. Increasing the distance between diode D1 and the cascode NMOS transistors effectively reduces the parasitic SCR effectiveness; however, it also reduces the full entitlement of substrate pump current delivered by diode D1 thereby reducing the ESD robustness.

A solution is required to effectively balance the trade-offs between ESD and Signal Latchup robustness. In the preferred embodiment circuit shown in FIG. 3, NWELL guardrings 40 and 42 are added around diodes D1 thru D4 instead of P+ guardrings. Guardring 42 surrounds diode D1 and is tied to pad 20. Guardring 40 surrounds diode D2 and any additional series diodes such as D3 and D4. Guardring 40 is tied to node A. NWELL guardrings disrupt the parasitic SCR operation by adding an additional N+ diffusion without affecting the substrate pump current delivered by diode D1. Resistor R3 is also added across diode D1 to reduce the impedance on Node A that will tend to keep a voltage $V_{be}$ from developing across diode D1 and discourage the parasitic SCR from triggering.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a diode device;
   a first Nwell guard ring surrounding the diode device;
   a first diode having a first end coupled to the diode device;
   a second Nwell guard ring surrounding the first diode;
   an output pad coupled to a second end of the first diode; and
   a first transistor coupled between the output pad and a substrate node.

2. The circuit of claim 1 further comprising a second transistor coupled between the first transistor and the output pad.

3. The circuit of claim 2 wherein the first and second transistors form a cascode device.

4. The circuit of claim 2 wherein the first and second transistors form an NMOS cascode device.

5. The circuit of claim 2 further comprising a resistor coupled between a control node of the second transistor and a voltage node.

6. The circuit of claim 2 further comprising a resistor coupled between a control node of the first transistor and the substrate node.

7. The circuit of claim 1 further comprising a resistor coupled in parallel with the first diode.

8. The circuit of claim 1 wherein the diode device is coupled between the first diode and a voltage node.

9. The circuit of claim 1 wherein the diode device comprises at least one diode coupled in series with the first diode.

10. A voltage tolerant circuit with improved latchup suppression comprising:
    a diode device having a first end coupled to a source voltage node;
    a first NWELL guard ring surrounding the diode device;
    a first diode coupled between a second end of the diode device and an output pad;
    a second NWELL guard ring surrounding the first diode; and
    a transistor device coupled between the output pad and a substrate node.

11. The circuit of claim 10 wherein the transistor device is a cascode device.

12. The circuit of claim 10 wherein the transistor device is a cascode NMOS device.

13. The circuit of claim 10 wherein the transistor device comprises:
    a first transistor having a first end coupled to the output pad; and
    a second transistor coupled between a second end of the first transistor and the substrate node.

14. The circuit of claim 13 further comprising:
    a first resistor coupled between a control node of the first transistor and the source voltage node; and
    a second resistor coupled between a control node of the second transistor and the substrate node.

15. The circuit of claim 10 further comprising a resistor coupled in parallel with the first diode.

16. The circuit of claim 10 wherein the diode device comprises at least one diode coupled in series with the first diode.

17. A voltage tolerant circuit with improved latchup suppression comprising:
    a diode device having a first end coupled to a source voltage node;
    a first NWELL guard ring surrounding the diode device;
    a first diode coupled between a second end of the diode device and an output pad;
    a second NWELL guard ring surrounding the first diode;
    a first NMOS transistor having a first end coupled to the output pad; and
    a second NMOS transistor coupled between a second end of the first transistor and the substrate node.

18. The circuit of claim 17 further comprising a resistor coupled in parallel with the first diode.

19. The circuit of claim 17 further comprising a resistor coupled between a control node of the first NMOS transistor and the source voltage node.

20. The circuit of claim 17 further comprising a resistor coupled between a control node of the second NMOS transistor and the substrate node.

* * * * *